United States Patent
Chai et al.

(10) Patent No.: US 8,667,440 B2
(45) Date of Patent: Mar. 4, 2014

(54) TCAD EMULATION CALIBRATION METHOD OF SOI FIELD EFFECT TRANSISTOR

(75) Inventors: Zhan Chai, Shanghai (CN); Jing Chen, Shanghai (CN); Jiexin Luo, Shanghai (CN); Qingqing Wu, Shanghai (CN); Xi Wang, Shanghai (CN)

(73) Assignee: Shanghai Institute of Microsystem and Information Technology, Chinese Academy of Sciences, Changning District, Shanghai (CN)

( * ) Notice: Subject to any disclaimer, the term of this patent is extended or adjusted under 35 U.S.C. 154(b) by 0 days.

(21) Appl. No.: 13/696,401

(22) PCT Filed: Sep. 23, 2011

(86) PCT No.: PCT/CN2011/080076
§ 371 (c)(1),
(2), (4) Date: Nov. 6, 2012

(87) PCT Pub. No.: WO2012/149766
PCT Pub. Date: Nov. 8, 2012

(65) Prior Publication Data
US 2013/0152033 A1    Jun. 13, 2013

(51) Int. Cl.
*G06F 9/455* (2006.01)
*G06F 17/50* (2006.01)

(52) U.S. Cl.
USPC ............ 716/112; 716/111; 716/113; 716/136

(58) Field of Classification Search
USPC .................. 716/111, 112, 113, 136
See application file for complete search history.

(56) References Cited

U.S. PATENT DOCUMENTS

| | | | |
|---|---|---|---|
| 6,871,330 B2 * | 3/2005 | Flatresse et al. | 716/113 |
| 8,015,514 B2 * | 9/2011 | Jaffe et al. | 716/54 |
| 2004/0243952 A1 * | 12/2004 | Croix | 716/4 |
| 2011/0131542 A1 * | 6/2011 | Botula et al. | 716/136 |
| 2012/0143569 A1 * | 6/2012 | Olubuyide et al. | 703/1 |

* cited by examiner

*Primary Examiner* — Vuthe Siek
*Assistant Examiner* — Brian Ngo
(74) *Attorney, Agent, or Firm* — Global IP Services; Tianhua Gu

(57) ABSTRACT

A calibration method for a device using TCAD to emulation SOI field effect transistor, where process emulation MOS device structures with different channel lengths Lgate are obtained by establishing a TCAD process emulation program; the process emulation MOS device structures are calibrated according to a TEM test result, a SIMS test result, a CV test result, a WAT test result, and a square resistance test result of an actual device, so as to complete TCAD emulation calibration of key electrical parameters of an SOI field effect transistor. Thereby, providing effective guidance for research, development and optimization of a new process flow are realized.

6 Claims, 3 Drawing Sheets

TCAD EMULATION CALIBRATION METHOD OF SOI FIELD EFFECT TRANSISTOR

CROSS REFERENCE TO RELATED PATENT APPLICATION

The present application is the US national stage of PCT/CN2011/080076 filed on Sep. 23, 2011, which claims the priority of the Chinese patent application No. 201110112178.1 filed on May 3, 2011, which application is incorporated herein by reference.

BACKGROUND OF THE PRESENT INVENTION

1. Field of Invention

The present invention relates to semiconductor device emulation technologies, and specifically to a Technology Computer Aided Design (TCAD) emulation calibration method of a Silicon On Insulator (SOI) field effect transistor, belonging to the field of micro-electronic devices.

2. Description of Related Arts

TCAD of an Integrated Circuit (IC) process and IC device technology is an important component of design and virtual manufacturing of an IC device, and is a powerful tool of rapidly analyzing characteristics of the IC process and device. IC TCAD mainly includes process emulation and device emulation. The process emulation mainly makes use of process flow emulation and process parameter emulation to obtain a virtual device structure, impurity distribution, junction depth, square resistance, and so on. The device emulation is mainly emulation performed on the virtual device structure by using a physical model of the device and test conditions to obtain parameters and a device characteristic curve. The application of IC TCAD could shorten a development cycle of the IC process and the IC device, reduce trial-production cost, further acquire information which is hard to obtain through experiments, and deepen physical research on IC process and device. At present, the simulation technology in which emulation is performed on the process and physical characteristics of the device by using a TCAD platform is widely applied in semiconductor manufacturing process and device design.

However, with the continuous reduction of IC feature size, the IC manufacturing process and the device structure characteristics tend to be more and more complex. In an actual application of TCAD emulation, an emulation result is usually distorted resulting in deviation between simulation device structure and an actual structure and a great error in emulation electrical parameters. For example, distortion of deposition and etching processes in process simulation results in a shape deviation of a spacer; mutual influence due to injection of multiple impurities many times and a stress and deformation of SOI Top Silicon result in a deviation of impurity distribution; the setting of a thickness Tox value of a gate oxide layer in device simulation has a deviation. The cases all greatly affect reliability and precision of TCAD emulation, so that a TCAD emulation result cannot provide effective guidance for an actual process and device research and development.

Therefore, the present invention provides a TCAD emulation calibration method of SOI field effect transistor, where TCAD emulation model parameters are reasonably and effectively calibrated by using actual test data such as transmission electron microscope TEM and secondary ion mass spectrometer SIMS results, a Capacitor Voltage (CV) test curve, and a Wafer Acceptance Test (WAT) of an actual device, so that in the same SOI process, TCAD emulation results of key parameters Vt and Idsat of Metal Oxide Semiconductor Field Effect Transistors (MOSFETs) of different sizes all meet a high-precision requirement that an error is less than 10%; moreover, accurate and effective pretest can be implemented in the case of multiple splits, thereby providing effective guidance for research, development and optimization of a new process flow.

SUMMARY OF THE PRESENT INVENTION

A technical problem to be solved by the present invention is to provide a TCAD emulation calibration method of an SOI field effect transistor.

In order to solve the foregoing technical problems, the present invention adopts the following technical solutions.

A TCAD emulation calibration method of an SOI field effect transistor comprises the following steps:

1) establishing a TCAD process emulation program according to an actual process flow, specific process parameters, and layout size information of an SOI CMOS; and running the process emulation program to obtain process emulation MOS device structures with different channel lengths Lgate;

2) performing actual tape-out according to the actual process flow and the specific process parameters of the SOI CMOS in step 1) and by using a layout matching the layout size information, to fabricate and obtain MOS devices with different channel lengths Lgate;

3) performing a TEM test on a sidewall spacer of a gate region by using the MOS device obtained through the actual tape-out, to obtain an actual shape of the sidewall spacer of the gate region of the MOS device, and calibrating a shape of a sidewall spacer of a gate region of the process emulation MOS device structure according to the actual shape;

4) performing an SIMS test on impurities of a well below the gate region by using the MOS device obtained through the actual tape-out, to obtain a well impurity distribution curve, and calibrating impurity distribution of a well in the process emulation MOS device structure according to the well impurity distribution curve;

5) performing an electrical CV test by using the MOS device obtained through the actual tape-out, obtaining a thickness fitted value of a gate oxide layer through a result of the electrical CV test, and calibrating a thickness Tox value of a gate oxide layer in the process emulation MOS device structure according to the thickness fitted value;

6) performing a WAT by using the MOS device obtained through the actual tape-out, drawing a change curve diagram illustrating that a threshold voltage Vt reduces with the channel length Lgate, and calibrating impurity lateral diffusion distribution of a source/drain (S/D) lightly doped extending region (Pocket) in the process emulation MOS device structure according to the change curve diagram, so that a change curve diagram illustrating that the threshold voltage Vt reduces with the channel length Lgate in the obtained process emulation MOS device structure is basically fitted with the change curve diagram illustrating that the threshold voltage Vt reduces with the channel length Lgate and drawn through the WAT;

7) performing a square resistance test by using the MOS device obtained through the actual tape-out, to obtain a square resistance of an S/D region, and calibrating impurity distribution of an S/D region in the process emulation MOS device structure according to the square resistance, so that a square resistance of the S/D region in the obtained process emulation MOS device is basically fitted with the actually tested square resistance of the S/D region; and 8) based on the process emulation MOS device structure obtained through calibration in steps 3) to 7), performing device electrical property emulation, to obtain, through operation, emulation results of key electrical parameters of MOS devices with different channel lengths Lgate, so as to complete TCAD emulation calibration of key electrical parameters of the SOI field effect transistor.

As a preferred solution of the present invention, in step 4), an impurity injection model and an impurity diffusion model for the well in the process emulation program are adjusted, so that the impurity distribution of the well of the obtained process emulation MOS device structure is basically fitted with the impurity distribution curve obtained through the actual SIMS test.

As a preferred solution of the present invention, in step 6), an impurity injection model and an impurity diffusion model for an S/D lightly doped extending region (Pocket) in the process emulation program are adjusted, and device electrical property emulation is performed on the obtained process emulation MOS device structure, so that the change curve diagram illustrating that the threshold voltage Vt reduces with the channel length Lgate in the obtained process emulation MOS device structure is basically fitted with the change curve diagram illustrating that the threshold voltage Vt reduces with the channel length Lgate and drawn through the WAT, wherein the diagram intuitively indicates an inverse short channel effect (or a short channel effect) degree of an actual MOS device, so that an inverse short channel effect degree or a short channel effect degree caused by the impurity lateral diffusion distribution of the Pocket in the obtained process emulation MOS device structure is fitted with the inverse short channel effect degree or the short channel effect degree of the actual MOS device.

As a preferred solution of the present invention, in step 7), an impurity injection model and an impurity diffusion model for the S/D region in the process emulation program are adjusted, so that the square resistance of the obtained process emulation MOS device structure is basically fitted with the actually tested square resistance.

As a preferred solution of the present invention, in step 8), based on the process emulation MOS device structure obtained through calibration in steps 3) to 7), and according to actual electrical parameter test conditions and relevant device physical models, a device emulation program is established to perform device electrical property emulation, wherein the device emulation program is run to obtain emulation results of key electrical parameters of MOS devices with different channel lengths Lgate.

As a preferred solution of the present invention, in step 8), the key electrical parameters comprise a threshold voltage Vt and a saturation current Idsat.

The beneficial effects of the present invention are as follows:

in the TCAD emulation calibration method provided in the present invention, TCAD emulation model parameters are reasonably and effectively calibrated by using actual test data such as TEM and SIMS results, a CV test curve, and a WAT test, so that in the same SOI process, TCAD emulation results of key parameters Vt and Idsat of MOSFETs of different sizes all meet a high-precision requirement that an error is less than 10%; moreover, accurate and effective pretest can be implemented in the case of multiple splits, thereby providing effective guidance for research, development and optimization of a new process flow.

DETAILED DESCRIPTION OF THE PREFERRED EMBODIMENTS

A TCAD calibration method consistent with the present invention is further described in the following with reference to the accompanying drawings.

The inventor of the present invention performs error analysis on a preliminary TCAD emulation result of an SOI field effect transistor, and find through research that, in comparison with WAT test data, for key electrical parameters, threshold voltages Vt and saturation currents Idsat, of MOS devices with different channel lengths, a great error occurring in the TCAD emulation result mainly results from deviations of injected impurity distribution of the well in the process emulation, injected impurity distribution of an S/D slightly doped extending region, injected impurity distribution of an S/D region, a shape of a sidewall spacer, and a thickness Tox value of a gate oxide layer in the device emulation. The injected impurity distribution of the well and the thickness Tox value of the gate oxide layer in the device emulation affect Vt and Idsat in all MOS devices with long channels; while the injected impurity distribution of the S/D slightly doped extending region, the injected impurity distribution of the S/D region, the shape of the sidewall spacer mainly affect Vt and Idsat of devices with short channels. If the deviations in these aspects are not reasonably and effectively calibrated, a great error may occur in the TCAD emulation results of electrical parameters of the device, greatly affecting reliability and precision of the TCAD emulation, so that the TCAD emulation result cannot provide effective guidance for the actual process and device research and development.

Figure 1:
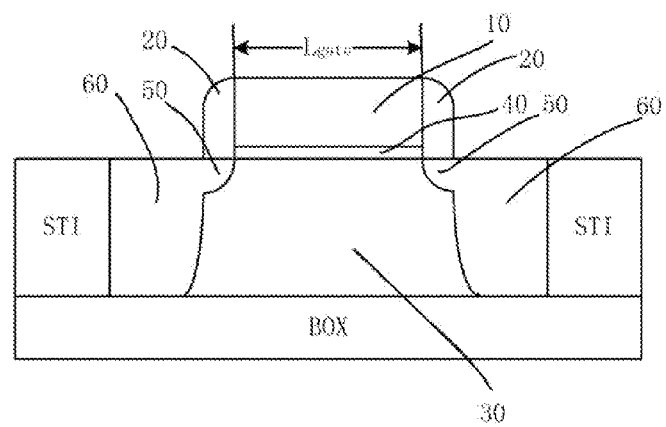
FIG. 1 is a schematic structural diagram of a process emulation device in step 1) according to an embodiment.
Figure 2:
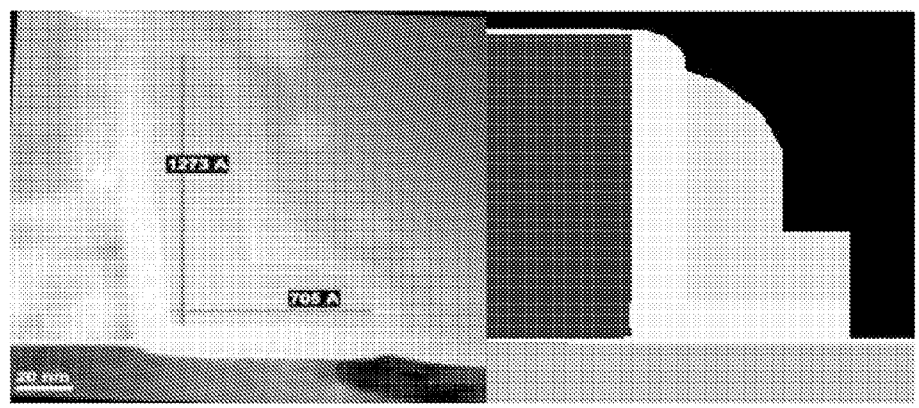
FIG. 2 is a diagram of comparison between a TEM test and an emulation structure of a sidewall spacer in a device structure according to an embodiment.
Figure 3:
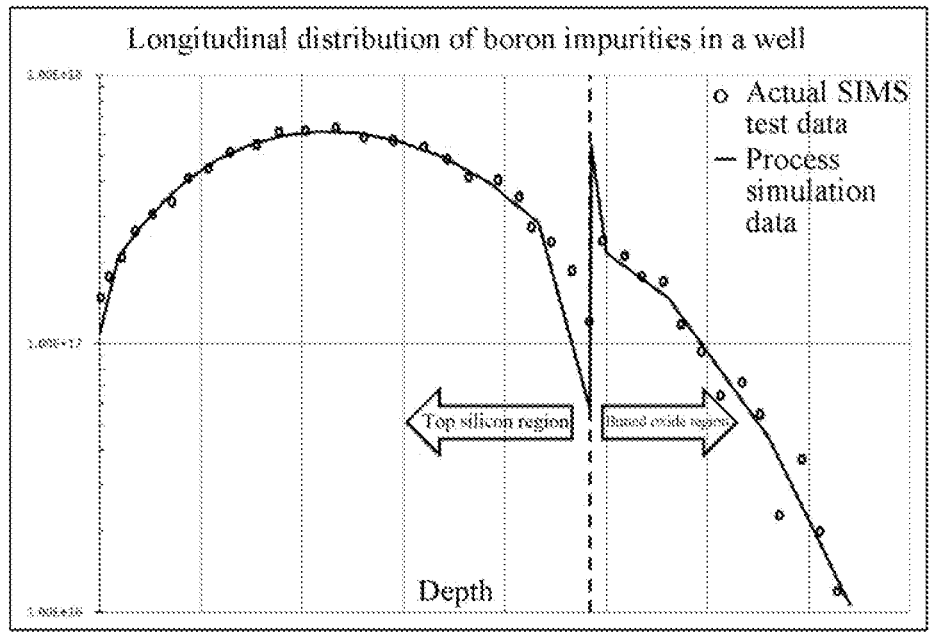
FIG. 3 is a diagram of comparison between a process emulation curve of well impurity longitudinal distribution and calibrated well impurity distribution data obtained through an actual SIMS test.
Figure 4:
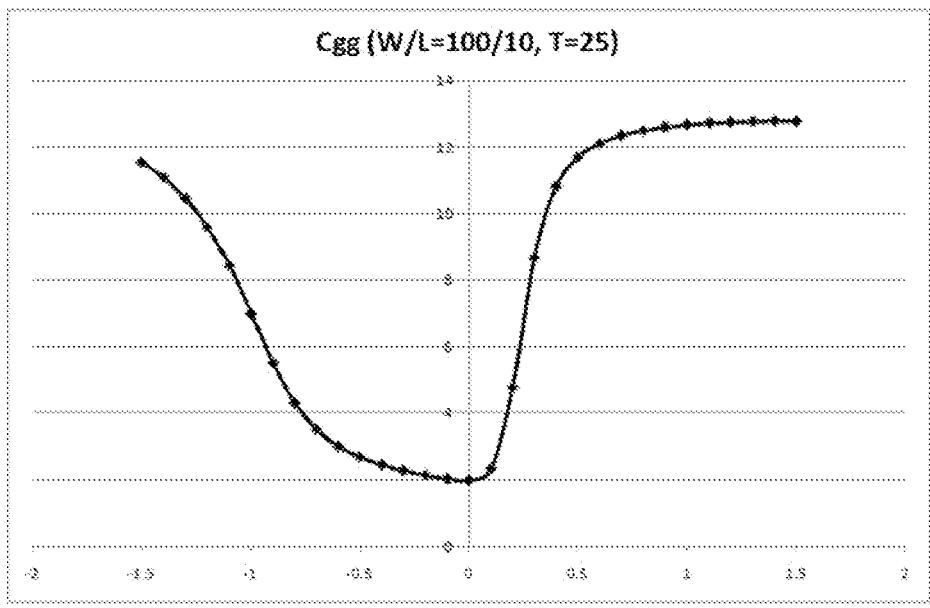
FIG. 4 is a fitted result diagram of an actually tested CV curve according to an embodiment.
Figure 5:
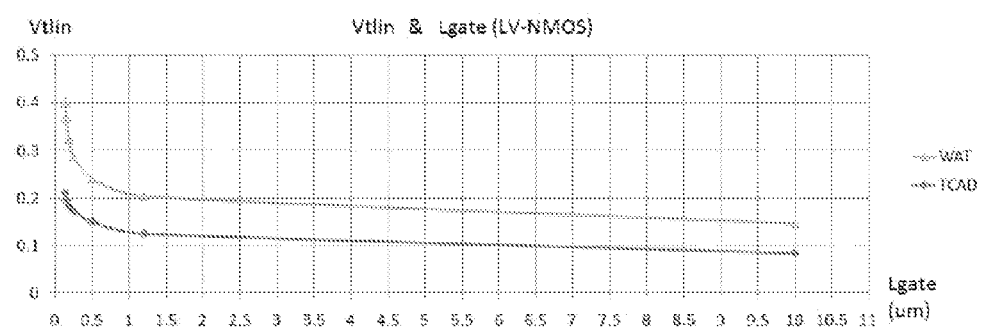
FIG. 5 is a diagram of comparison between change curves illustrating that a threshold voltage Vt reduces with a channel length Lgate according to an embodiment, where an upper data line indicates data obtained through a WAT test, and a lower data line indicates device emulation data.

Based on the foregoing analysis and research, the inventor of the present invention proposes a reasonable TCAD emulation calibration method of an SOI field effect transistor, where TCAD emulation model parameters are reasonably and effectively calibrated by using actual test data such as TEM and SIMS results, a CV test curve, and a WAT test of an actual device. The TCAD emulation calibration method consistent with the present invention specifically includes the following steps:

1) establishing a complete TCAD process emulation program according to an actual process flow, specific process parameters, and layout size information of an SOI CMOS, where the specific process parameters include: a thickness of a buried oxide layer (BOX) in an SOI substrate slice; a thickness, a doping type, and a resistivity of top silicon; a type, a dose, energy, an inclination angle, a rotation angle of impurities in an injection process; temperature, time, atmosphere, and a temperature rise or reduction rate of an anneal process or oxidization process; a classification, a thickness, a resistivity, or doping concentration of materials in a deposition process or an epitaxial process; a classification, an etching type, and a thickness of materials in an etching process; and layout size information used in a photoetching process; and specifically include an oxide layer thickness after oxidization each time and before injection each time; running the process emulation program to obtain process emulation device structures (a schematic sectional diagram is shown in FIG. 1) with different channel lengths Lgate; moreover, based on each process emulation device structure, further establishing a device emulation program according to an actual electrical parameter test conditions and relevant device physical models, and running the program to obtain preliminary emulation results of key electrical parameters Vt and Idsat of MOS devices with different channel lengths Lgate;

2) performing actual tape-out according to the actual process flow and the specific process parameters of the SOI CMOS in step 1) and by using a layout matching the layout size information, to fabricate and obtain MOS devices with different channel lengths Lgate;

3) performing a TEM test on a sidewall spacer of a polysilicon gate region by using the MOS device obtained through the actual tape-out, to obtain an actual shape, especially the width, of the sidewall spacer of the device, and calibrating a shape of a sidewall spacer 20 of the process emulation MOS device structure according to the actual shape, as shown in FIG. 2;

4) performing an SIMS test on impurities of a well below the polysilicon gate region by using the MOS device obtained through the actual tape-out, and adjusting an impurity injection model and an impurity diffusion model for a well in the process emulation program, so that impurity distribution of a well 30 below a gate region 10 obtained through process emulation is basically fitted with an impurity distribution curve obtained through an actual SIMS test, as shown in FIG. 3;

5) performing an electrical CV test on the actual device test structure, and obtaining a thickness fitted value of a gate oxide layer through an actual test CV curve (shown in FIG. 4), for calibrating a thickness Tox value of a gate oxide layer 40 in the device emulation;

6) drawing, according to the WAT test, a change curve diagram illustrating that a threshold voltage Vt reduces with a channel length Lgate, as shown in FIG. 5 intuitively indicating an inverse short channel effect (or a short channel effect) degree of an actual MOS device; then adjusting an impurity injection model and an impurity diffusion model for an S/D lightly doped extending region 50 in the process emulation program, and performing device electrical property emulation on the obtained process emulation MOS device structure, so that a change curve diagram illustrating that the threshold voltage Vt reduces with the channel length Lgate in the obtained process emulation MOS device structure is basically fitted with the change curve diagram illustrating that the threshold voltage Vt reduces with the channel length Lgate and drawn through the WAT test, thereby enabling impurity lateral diffusion distribution of the S/D lightly doped extending region 50 in an emulation result and an inverse short channel effect degree caused due to the impurity lateral diffusion distribution to be more in conformity with actual conditions;

7) calibrating, according to an actually tested square resistance result, impurity injection distribution and lateral diffusion of an S/D region 60, where an impurity injection model and an impurity diffusion model for the S/D region in the process emulation program are adjusted, so that a square resistance of the S/D region 60 of the obtained process emulation MOS device structure is basically fitted with an actually tested square resistance; and 8) based on the process emulation MOS device structure obtained through calibration in steps 3) to 7), and according to actual electrical parameter test conditions and relevant device physical models, establishing a device emulation program to perform device electrical property emulation, and running the program to obtain emulation results of key electrical parameters of MOS devices with different channel lengths Lgate, so as to complete TCAD emulation calibration of the key electrical parameters of the SOI field effect transistor.

Through the calibration in foregoing steps, Table 1 can be obtained. Table 1 shows error comparison between TCAD emulation results of key parameters Vt and Idsat of MOSFETs of different sizes in the same SOI process and actual test WAT results. It can be seen that, in the same SOI process, TCAD emulation results of key parameters Vt and Idsat of MOSFETs of different sizes all meet a high-precision requirement that an error is less than 10%, and accurate and effective pretest can be implemented in the case of multiple splits.

TABLE 1

|  | Lgate | WAT | TCAD | Relative Error | Absolute Error |
|---|---|---|---|---|---|
| Vtlin | 10 | 0.1168 | 0.1164 | −0.3% | −0.0004 |
|  | 1.2 | 0.1736 | 0.1729 | −0.4% | −0.0007 |
|  | 0.5 | 0.2092 | 0.2073 | −0.9% | −0.0019 |
|  | 0.24 | 0.256 | 0.2547 | −0.5% | −0.0013 |
|  | 0.18 | 0.294 | 0.2935 | −0.2% | −0.0005 |
|  | 0.15 | 0.3356 | 0.3318 | −1.1% | −0.0038 |
|  | 0.13 | 0.374 | 0.3696 | −1.2% | −0.0044 |
| Ids | 10 | 20.438 | 19.25 | −5.8% | −1.1880 |
|  | 1.2 | 137.69 | 140 | 1.7% | 2.3100 |
|  | 0.5 | 258.86 | 267.7 | 3.4% | 8.8400 |
|  | 0.24 | 387.24 | 404 | 4.3% | 16.7600 |
|  | 0.18 | 437.94 | 449.68 | 2.7% | 11.7400 |
|  | 0.15 | 473.73 | 480 | 1.3% | 6.2700 |
|  | 0.13 | 505.51 | 499.1 | −1.3% | −6.4100 |

It can be seen that, through the TCAD emulation calibration method provided in the present invention, the TCAD emulation model parameters are reasonably and effectively calibrated, thereby effectively implementing advantages and functions of IC TCAD in shortening a development cycle of the IC process and the IC device, saving a trial-production cost, and guiding research, development and optimization of a new process flow.

Other technologies involved in the present invention fall within a scope known by persons skilled in the art, and the details are not described herein again. The foregoing embodiment is merely used to illustrate, but not intended to limit, the present invention. Any technical solutions without departing from the spirit and scope of the present invention shall fall within the scope of the claims of the present invention.

What is claimed is:

1. A calibration method for a device using Technology Computer Aided Design (TCAD) to emulate a Silicon On Insulator (SOI) field effect transistor comprising the following steps:

1) establish a TCAD process emulation program according to an actual process flow, specific process parameters and layout size information of an SOI CMOS; and running the TCAD process emulation program to obtain a process emulation Metal Oxide Semiconductor (MOS) device structures with different channel lengths Lgate by the device;

2) performing actual tape-out according to the actual process flow and the specific process parameters of the SOI CMOS in step 1) and by using a layout matching the layout size information to fabricate and obtain MOS devices with different channel lengths Lgate by a wafer process production line;

3) performing a Transmission Electron Microscope (TEM) test to the MOS device obtained through the actual tape-out to obtain an actual shape of the sidewall spacer of a gate region of the MOS device, and calibrating a shape of a sidewall spacer of a gate region of the process emulation MOS device structure according to the actual shape by the device;

4) performing a secondary ion mass spectrometer (SIMS) test on impurities of a well below the gate region to the MOS device obtained through the actual tape-out to obtain a well impurity distribution curve, and calibrating impurity distribution of the well in the process emulation MOS device structure according to the well impurity distribution curve by the device;

5) performing an electrical Capacitor Voltage (CV) test to the MOS device obtained through the actual tape-out to obtain a thickness fitted value of a gate oxide layer through a result of the electrical CV test, and calibrating a thickness Tox value of a gate oxide layer in the process emulation MOS device structure according to the thickness fitted value by the device;

6) performing a Wafer Acceptance Test (WAT) to the MOS device obtained through the actual tape-out to obtain a change curve diagram illustrating that a threshold voltage Vt reduces with the channel length Lgate, and calibrating impurity lateral diffusion distribution of a source/drain (S/D) lightly doped extending region in the process emulation MOS device structure according to the change curve diagram by the device, so that a change curve diagram illustrating that the threshold voltage Vt reduces with the channel length Lgate in the obtained process emulation MOS device structure is basically fitted with the change curve diagram illustrating that the threshold voltage Vt reduces with the channel length Lgate and drawn through the WAT;

7) performing a square resistance test to the MOS device obtained through the actual tape-out to obtain a square resistance of an S/D region, and calibrating impurity distribution of an S/D region in the process emulation MOS device structure according to the square resistance by the device, so that a square resistance of an S/D region in the obtained process emulation MOS device is basically fitted with the actually tested square resistance of the S/D region; and 8) based on the process emulation MOS device structure obtained through the calibrations in steps 3) to 7), performing device electrical property emulation by the device, to obtain, through operation, emulation results of key electrical parameters of MOS devices with different channel lengths Lgate, so as to complete the calibration for the device.

2. The calibration method of claim 1, wherein in step 4), an impurity injection model and an impurity diffusion model for the well in the process emulation program are adjusted, so that impurity distribution of the well of the obtained process emulation MOS device structure is basically fitted with the impurity distribution curve obtained through an actual SIMS test.

3. The calibration method of claim 1, wherein in step 6), an impurity injection model and an impurity diffusion model for an S/D lightly doped extending region in the process emulation program are adjusted, and device electrical property emulation is performed on the obtained process emulation MOS device structure, so that the change curve diagram illustrating that the threshold voltage Vt reduces with the channel length Lgate in the obtained process emulation MOS device structure is basically fitted with the change curve diagram illustrating that the threshold voltage Vt reduces with the channel length Lgate and drawn through the WAT.

4. The calibration method of claim 1, wherein in step 7), an impurity injection model and an impurity diffusion model for an S/D region in the process emulation program are adjusted, so that the square resistance of the obtained process emulation MOS device structure is basically fitted with the actually tested square resistance.

5. The calibration method of claim 1, wherein in step 8), based on the process emulation MOS device structure obtained through calibration in steps 3) to 7), and according to actual electrical parameter test conditions and relevant device physical models, a device emulation program is established to perform device electrical property emulation, wherein the device emulation program is run to obtain emulation results of key electrical parameters of MOS devices with different channel lengths Lgate.

6. The calibration method of claim 1, wherein in step 8), the key electrical parameters comprise a threshold voltage Vt and a saturation current Idsat.

* * * * *